United States Patent
Karlqvist

[11] Patent Number: 5,808,703
[45] Date of Patent: Sep. 15, 1998

[54] DEVICE FOR DETECTION OF TRANSMISSION FROM REMOTE CONTROL

[76] Inventor: Jan Karlqvist, Ruddammsvägen 15, 7th floor, S-114 21 Stockholm, Sweden

[21] Appl. No.: 624,427
[22] PCT Filed: Nov. 18, 1994
[86] PCT No.: PCT/SE94/01094
§ 371 Date: May 22, 1996
§ 102(e) Date: May 22, 1996
[87] PCT Pub. No.: WO95/15029
PCT Pub. Date: Jun. 1, 1995

[30] Foreign Application Priority Data

Nov. 22, 1993 [SE] Sweden ................................ 9303868

[51] Int. Cl.[6] ..................................................... H04N 5/44
[52] U.S. Cl. ............................ 348/734; 348/5.5; 348/725
[58] Field of Search .................................. 348/734, 726, 348/731, 2, 553, 732, 5.5, 725; 340/825.69, 825.72; 341/176; 359/145, 146; 380/6, 3, 7; 455/26.1, 353, 352, 92, 151.2, 161.1, 181.1, 160.1; H04N 5/44

[56] References Cited

U.S. PATENT DOCUMENTS 5,109,222  4/1992  Welty ............................... 340/825.72

FOREIGN PATENT DOCUMENTS

| 59-171397 | 9/1984 | Japan | H04Q 9/00 |
| 3-191696 | 8/1991 | Japan | H04Q 9/02 |
| 4-063097 | 2/1992 | Japan | H04Q 9/00 |
| 4-178098 | 6/1992 | Japan | H04N 5/44 |

*Primary Examiner*—John K. Peng
*Assistant Examiner*—Jeffrey S. Murrell
*Attorney, Agent, or Firm*—Young & Thompson

[57] ABSTRACT

An apparatus is provided which gives feedback to a user of a remote control device, such as that for a television, to indicate when excessive use of the remote control (channel surfing) is occurring. The device detects transmission from a remote control device and counts the transmissions during an predetermined time period. When a predetermined maximum number of commands from the remote control device is received, an indication of such is provided to the viewer. This indication may take the form of a visual indication such as flashing a message, an auditory alarm, disabling of the remote control device by jamming the inferred signal, or automatically controlling operation of the remote control device, which may include turning off the device. Programming of the apparatus through use of the remote control to accomplish advanced features is also provided.

16 Claims, 3 Drawing Sheets

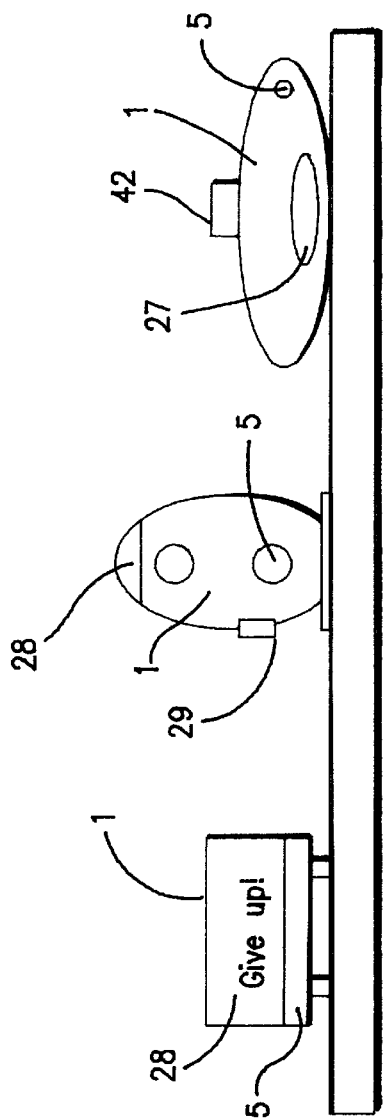
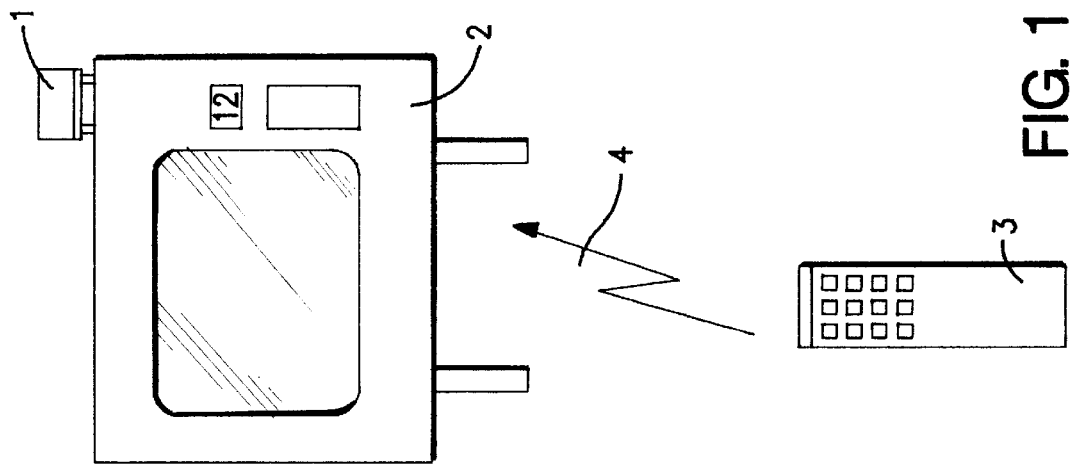

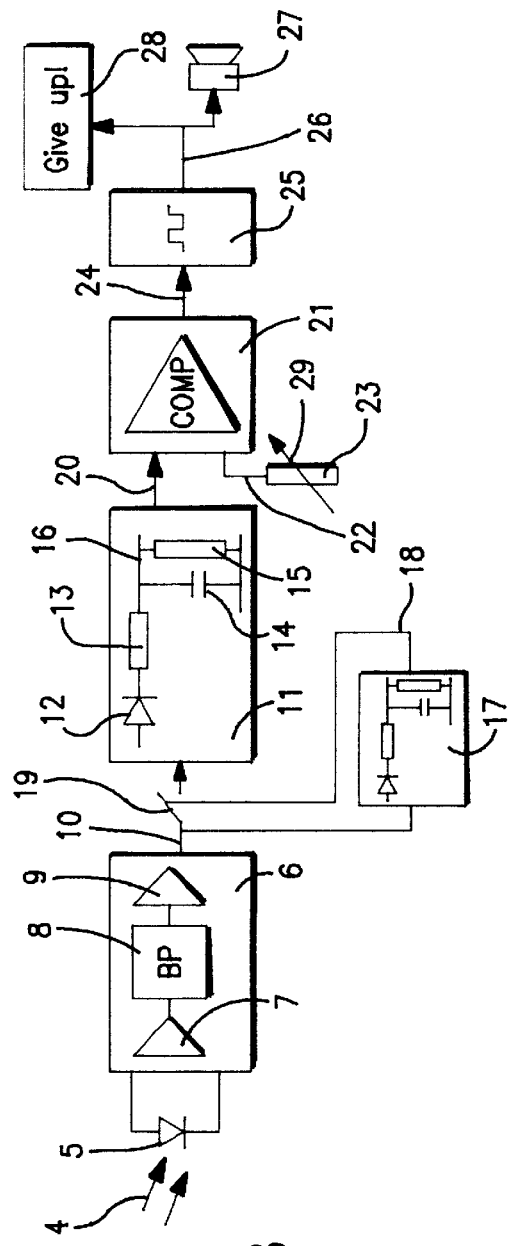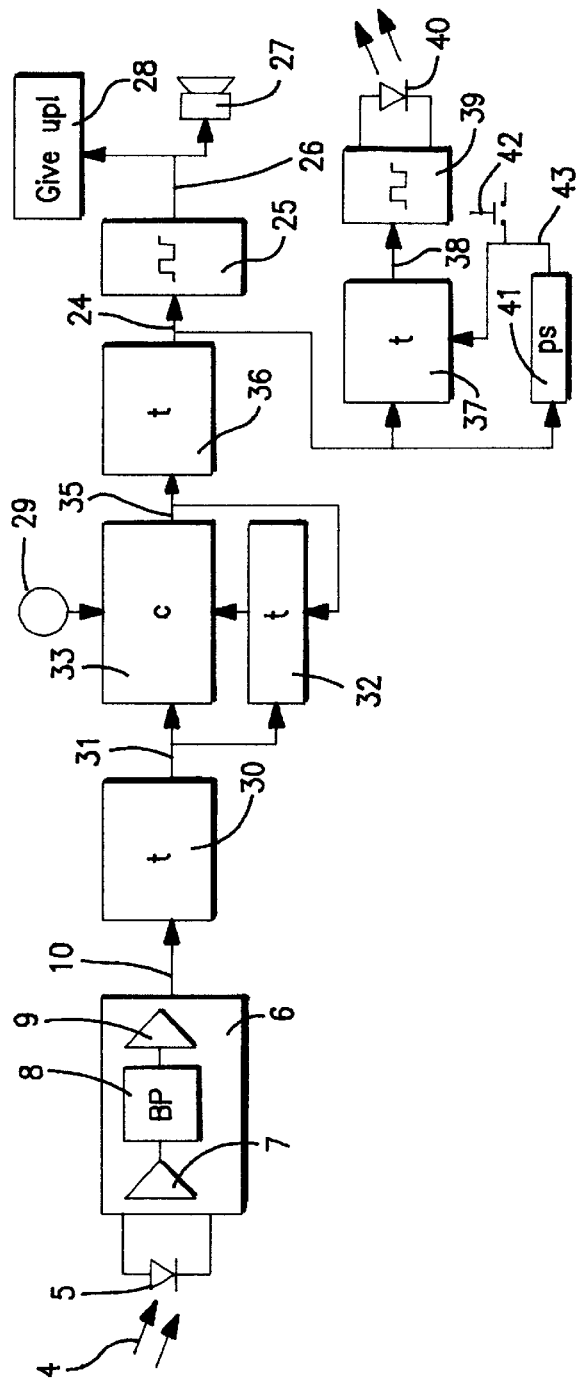
FIG. 3
FIG. 4

DEVICE FOR DETECTION OF TRANSMISSION FROM REMOTE CONTROL

BACKGROUND OF THE INVENTION

1. Field of the Invention

The present invention relates to a device to provide an indication to a user of a remote control device that the user is engaging in "channel surfing".

2. Description of the Related Art

A television viewer can today receive a great number of channels on his TV. It is not unusual that the number of channels is 20 or more. When the choice is so varied, the TV viewer often switches between the channels with his remote control in his desire to find other channels with better TV programs.

Switching between channels brings the viewer to another channel believed to be better than the previous one. But after a short while he discovers that the new channel does not offer any better programs and starts to switch channels again. When the switching is repeated several times it is called "channel surfing". The viewer finally ends up surfing instead of actually watching TV.

SUMMARY OF THE INVENTION

The object of the invention is to make the viewer stop or reduce surfing.

The inventive device, that has a detector built in, is placed close to the TV set, according to FIG. 1. The detector detects each time the viewer activates his remote control.

When the inventive device (1) has detected a certain number of activations for the remote control (3), during a defined length of time, the inventive device provides an indication that surfing is going on.

The indication can vary depending on how the viewer chooses to be informed that he is surfing. The indication is given by the inventive device (1) for a certain length of time, perhaps a couple of seconds, in the form of:

an acoustic sound,
 a flashing lamp
 a voice message which is replayed,
 a short passage of music which is played,
 lights up a sign with a suitable text e.g. "STOP", "GIVE UP", "GO TO BED".
 the inventive device sends a power-off signal to the TV set.
 a jammer transmitter, that locks out the function of the remote control (3), is switched on and makes it impossible to continue surfing during a certain time length.

Depending on which way of signalling the inventive device uses, the inventive device can assume different shapes and forms according to FIG. 2.

When the remote control uses infrared light, the jammer transmitter in the inventive device uses the method to blend or send false signals to the TV set remote control receiver. Since the TV set receives false signals the TV set can not take in signals from the ordinary remote control.

The function of the jammer transmitter is constructed so that the inventive device first gives a warning before the jammer transmitter is activated. Through the warning the viewer is notified that he has approximately 10 seconds to decide which channel he wants to view during the time period that the jammer transmitter is activated. The time length of the period can be relatively long, e.g., 10 to 30 minutes.

Instead of having a certain length of time during which the jammer transmitter is activated, it can be more suitable to have random time length when the jammer transmitter is activated. The time length is randomized each time surfing is detected and can be set from seconds to several minutes. This way, the viewer shall not know in advance when the jammer transmitter will be activated. The viewer shall not be able to determine when it will be possible to start surfing again.

For some viewers, the optical or acoustic indications are not enough to make him stop surfing. In these cases the inventive device is equipped with a reset button which has to be activated to stop the indication. The reset button is designed so that the viewer has to rise from his chair to push it. How long the reset button has to be held down depends on the intended degree of difficulty for the viewer to reset the inventive device. Instead of the above described messages and actions it can sometimes be better to show how frequent the viewer uses the remote control, e.g., a frequency counter.

The frequency counter can be realized as a number of lamps in a bar that are illuminated depending on the frequency of use, or as a numeric value on a display.

Of course, the inventive device can be used for all sorts of equipment that are controlled by a remote control, e.g. radio receivers, CD players or videos, to prevent frequent changes of channels and programs.

BRIEF DESCRIPTION OF THE DRAWINGS

FIG. 1 illustrates one embodiment of the invention placed by a TV set.

FIG. 2 illustrates different exterior appearances of the invention.

FIG. 3 is a simplified block schematic illustrating one embodiment of the invention.

FIG. 4 is a simplified block schematic illustrating one embodiment of the invention where the invention is equipped with a jammer transmitter.

DETAILED DESCRIPTION OF THE INVENTION

Figure 5:
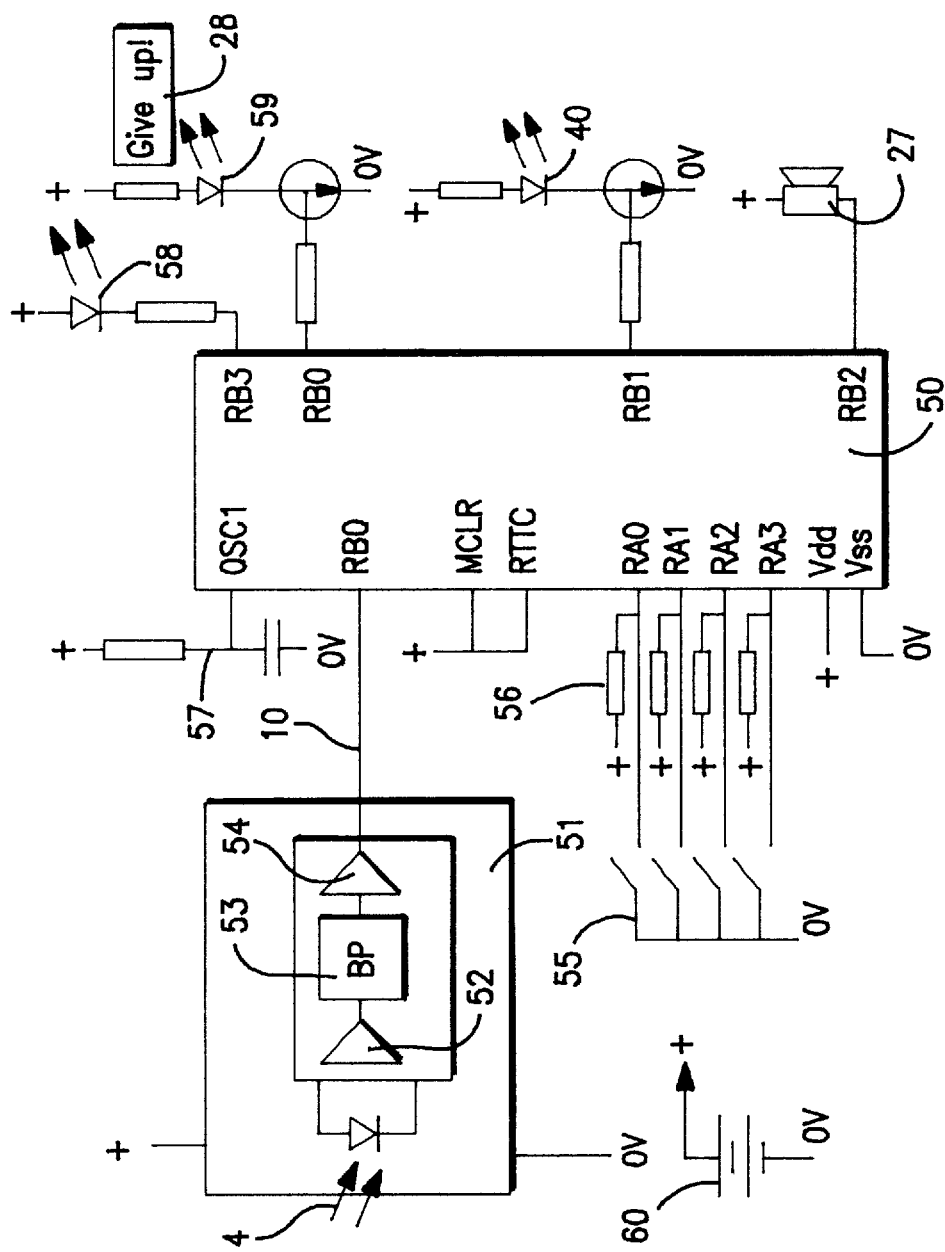
FIG. 5 is an electrical circuit schematic where the invention is realized in a microprocessor.

FIG. 1 illustrates the inventive device (1) placed on a TV set (2). The remote control (3) sends a command (pulse train) (4) which is received by the TV set (2) and also received by the inventive device (1).

In FIG. 3 the inventive device is explained in greater detail in the block schematic, herein showed for a remote control (3) that uses infrared light as transmission media. When the remote control (3) is activated the photo diode (5) is activated by a pulse train of IR-light (4). The pulse train from the photo diode (5) is transmitted to the detector (6), which consists of an amplifier (7), a bandpass filter (8), and a limiter (9). The amplified and bandpass filtered pulse train is produced as a signal (10) that is transmitted to a surf detector (11).

The function of the surf detector (11) is achieved when the signal (10) passes through the diode (12) and the resistive element (13) and charges the capacitor (14). When the remote control is used the voltage across the capacitor (14) will rise, as measured at (16). When the voltage at (16) has risen to a certain level, surfing is detected via signal (24).

The frequency of use of the remote control (3) that is to be considered as surfing is decided by the values of resistors (13), (15) and (23). The resistor (23) value is changed by the control device (29).

To prevent the surf detector (11) from responding to normal use of the remote control (3), the two resistance elements (13) and (15) have suitable values according to the following: The resistor (13) determines the threshold of how many commands from the remote control (3) are received during a period of time, while the length of the period of time is controlled by the resistor (15).

Most remote controls (3) on the market repeat a chosen command until the button on the control is released. This means that the inventive device will receive a great number of pulses on the signal (10). The pulses will rapidly cause the voltage (16) to rise and surfing will be indicated. Such false indications become especially prevalent when one uses a video recorder.

When a video recorder is used it is usual that the viewer uses the fast forward command button on the remote control (3) and holds it down for a period of time, e.g., to fast forward through commercial advertising. As a result, the remote control (3) during the entire fast forward sequence will send pulses which are received and translated into signal (10).

To prevent this type of false indication of surfing the following actions can be taken: A viewer can not change channels faster than 3 to 4 times per second. This means that the pulse trains can be transmitted at the fastest every 250 ms. If they come with higher frequency, it can be assumed that it is the remote control (3) that generates them, as opposed to actual surfing.

By measuring the time between the pulse trains is it possible to determine whether they come from a repeating remote control (3) or if they are the beginning of a surfing sequence.

An activity detector (17) provides a control signal (18) when the signal (10) changes level with a frequency higher than once every 250 ms.

When this happens the switch (19) is opened by the control signal (18) and the inventive device (11) is switched off.

Through this arrangement the inventive device will not indicate surfing from the use of fast forward on the video recorder or if any button on the remote control (3) is activated during a longer period of time.

The activity detector (17) is constructed in the same way that the surf detector (11) but with a different time constant according to the above described assumption.

The voltage (16) from the surf detector (11) is fed via signal (20) to a comparator (21) that compares the voltage of (20) with a reference voltage (22) that is pre-set by the resistor (23). If the voltage (20) is greater than the reference voltage (22), a signal (24) is set active, and surfing is detected. The signal (24) activates a multivibrator (25). The output (26) of the multivibrator (25) is, in FIG. 3, connected to a lamp and a speaker (27). The lamp makes the sign (28) flash. The pulsing of the speaker (27) and the lamp is achieved as the pulse frequency on the multivibrator (25) is set on a couple of Hz.

To make the signal (24) last for a short while after the surfing has stopped, the comparator (21) incorporates a hysteresis function.

In FIG. 4 the inventive device is shown in a form modified from that of FIG. 3. Identical reference numbers are used, and are not explained again. In FIG. 4 the inventive device has been completed with a jammer transmitter than consists of a timer (37), a multivibrator (39), an IR-light diode (40), a pseudorandom generator (41) and a reset device (42).

In this embodiment a digitized network is used to realize the surf detector (11) that consists of a counter (33) and a timer (32). The activity detector (17) is replaced with a monostable multivibrator (30).

Just as described in FIG. 3 with respect to false surf indications, these must be eliminated in this embodiment also.

A retriggerable monostable multivibrator (30) is triggered by the pulse train on the signal (10). The monostable multivibrator (30) provides a pulse on the signal (31) only if the pulse train on signal (10) comes more seldom than once every 250 ms. If the pulse trains occur with higher frequency they will retrigger the monostable multivibrator (30) and the pulse on the signal (31) will not be generated. In that case the pulse will not occur until the last pulse train is transmitted, e.g., when the time between the pulse train is longer than 250 ms. The monostable multivibrator (30) is set on 250 ms, according to the assumption described in FIG. 3.

Assume that the timer (32) is in its original state and that the counter (33) is reset. When a pulse is transmitted to the timer (32) through the signal (31), the timer (32) will start and run for approximately 10 minutes, even if more pulses reach the signal (31) during this time period. The timer (32) is not retriggerable. The timer (32) releases the counter (33) with the signal (34). The counter (33) begins to count the number of pulses on the signal (31). When the period measured by the timer (32) has elapsed, the counter (33) is reset by the signal (34). At the next pulse on the signal (31), the timer (32) will be started again and the procedure will be repeated.

If the counter (33), while the timer (32) is running, is able to count, e.g., 25 or more pulses, the signal (35) is given, indicating that surfing is detected. The signal (35) starts the timer (36) which gives the signal (24) that activates the multivibrator (25). The function of the timer (36) is to make surf indication active during a short time after surfing has been detected. The signal (35) also forces the timer (32) to its original state which then gives the signal (34) that resets the counter (33). The timer (32) is now ready to restart on the next pulse on signal (31).

When surfing shall be indicated can be regulated by the control device (29), which decides when the counter (33) shall give the signal (35), that is how many pulses that shall be counted by the counter (33) on signal (31) before signal (35) is given. The timer (32) determines how long the counter (33) shall count, a suitable time for the timer (32) being 10 minutes. If the inventive device is equipped with the jammer transmitter, it is activated when the signal (24) disappears. In this way the viewer is notified with speaker (27) and the sign (28) that the jammer transmitter soon will be switched on. When the signal (24) disappears the timer (37) is started and its output (38) activates the multivibrator (39). The multivibrator (39) pulses the IR-diode (40) with a frequency of around 40 kHz, which disturbs the remote control receiver of the TV set when the light of IR-diode light on the TV set remote control receiver detects these false signal. Suitable time for the timer (37) is between 10 and 30 minutes.

The multivibrator (39) will be powered until the signal (38) is removed. The signal can disappear in three ways:

1. Signal (39) from the pseudorandom generator (41).
2. The time in the timer (37) has elapsed.
3. The reset device (42) is activated.

The occasions 1 and 3 is described below.

At the same time that the signal (24) is activated, a pseudorandom generator (41) is activated, its function being to give the signal (39), after a random length of time, that lasts from seconds to tens of minutes. When the signal (39) is given the timer (37) will be reset and the signal (38) disappears which turns off the multivibrator (39). By this arrangement the jammer transmitter will be powered for a random length of time.

The viewer can, if he wishes, turn off the jammer transmitter through the reset device (42), which in turn resets the timer (37).

In FIG. 5 the inventive device is constructed with the aid of a micro computer (50), PIC 16c54 from Microchip Technology Inc. USA. In this example, an IR-receiver (51) and an amplifier are incorporated into the same integrated circuit (51), IS1U60 from the Japanese company Sharp. Commands from the remote control (3) that are sent with IR-light (4) are amplified in the amplifier and the limiter (52), bandpass filtered in filter (53) that has a middle frequency of approximately 38 kHz, and thereafter the signal is demodulated in the demodulator (54). On the demodulator output gate (10) a binary pulse train is provided which is fed into the micro computer through the input gate RBO. The electrical connectors (55) are used for settings in the same way as the devices (29) and (42). The resistors (56) are pullups used to guarantee a logical "one-level" when the contacts (55) are open. The RC-net (57) is the time contact to the clock generator for the micro computer (50). The light diode (59) lights up the sign (28). The outputs RBO ... RB3 control each function (28), (40), (27) and (58). The inventive device is powered by battery (60).

The software in the micro computer (50) is mainly an application of the function of the inventive device as described in FIG. 4. When a micro computer is used to implement the inventive device, complex functions are easily added to the inventive device, which otherwise wouldn't be possible in an analog implementation as shown in FIG. 3, or would require too much space in a digitized network as shown in FIG. 4.

Examples of complex functions are:

Detecting and recognizing one or several commands from the remote control (3).

Transmission of commands from the inventive device (1) to the TV set (2).

Identification of the viewer, by making the viewer send a special code from the remote control (3).

Receiving of control commands to the inventive device (1) from the remote control (3).

Detecting commands is useful in cases when the viewer also looks at Teletext. Through training of the inventive device, from the remote control (3), it can be made to recognize commands that mean the viewer is viewing Teletext and switch off the surf detector. Otherwise the viewers repeated actuation of the buttons on the remote control would be interpreted as channel changes when they actually are page number for the Teletext.

Instead of that, the viewer instructs the inventive device which button is used for changing to Teletext, or this can be programmed into the inventive device already at the factory. This can also be applied for commands that controls the video recorder. These commands shall not be detected as surfing. It is also detected when the viewer changes back from Teletext to TV, and the surf detector is switched on again. This command is programmed into the inventive device to be able to detect such a command.

The IR-diode (40) can, of course, also be used to transmit commands to the TV set. Such a command can be to switch off the TV set (2) when surfing is detected, or to send a certain sequence of commands, e.g., choose a special TV channel when surfing is performed or to send a specific sequence at a specific time.

Training of these commands, or other commands that shall be transmitted to the memory of the inventive device, for recognition or commands that shall be transmitted, is made by activating the remote control, pointing it at the inventive device and pushing a certain button (55), the training is completed. The fact that training is going on and is completed is shown by the light diode (58).

Identification of the viewer or receiving of the control commands from the remote control (3) can be done by transmitting a specific sequence (code) from the remote control (3) e.g. "decrease brightness", "1", "2", "3", "4", which will be detected by the inventive device. Identification can be used to shut down the inventive device for a while. Another code can be used to change the presets in the inventive device, which otherwise have to be done with the devices (29) and (42). A third code may be used to inform the viewer how many channel changes he has done, or other such statistics. When the inventive device detects such a code it will collect the number of channel changes performed so far from the built in memory. This is possible by using a counter in the micro computer that counts each time a change of channel is made, and when the code "information about the number of channel changes" is detected, the inventive device will transmit the number on the light diode (40) as the number commands from the remote control (3).

By sending the number as number commands the commands will be detected by the TV set. To make it easier to interpret the number of changes of channels, the inventive device first will send the command "change to Teletext" and after that send the number of channel changes. The number of changes will correspond to a Teletext page with that number, e.g. page 135 means that 135 changes of channels have been made.

I claim:

1. A device for detection and indication of frequent use of a remote control device for an apparatus, comprising:

a detector which detects when the remote control device is used by detecting infrared light transmissions from the remote control device;

a counter which counts a number of detections during a predetermined time period; and a remote jamming device, capable of preventing use of the remote control device;

wherein when the number of detections exceeds a predetermined number during the predetermined time period, an indication is provided.

2. The device of claim 1, wherein the remote jamming device comprises:

an infrared light transmitting diode to jam the transmissions of the remote control device;

a timer for controlling a length of a period during which the remote jamming device is active;

a pseudorandom timing generator which, when activated, enables the remote jamming device for an indeterminate period of time; and a multivibrator designed to pulse the infrared light transmitting diode at a frequency which will jam the transmissions of the remote control device.

3. The device of claim 1, wherein the remote jamming device is designed to prevent use of the remote control device for a set period of time.

4. The device of claim 1, wherein the remote jamming device is designed to prevent use of the remote control device for an indeterminate period of time.

5. The device of claim 1, wherein the remote jamming device is controlled by a microcomputer.

6. The device of claim 1, wherein the remote jamming device further comprises a reset mechanism, the reset mechanism disabling the remote jamming device when the reset mechanism is activated.

7. A device for detection and indication of frequent use of a remote control device for an apparatus, comprising:
   a detector which detects when the remote control device is used by detecting infrared light transmissions from the remote control device; and
   a counter which counts a number of detections during a predetermined time period;
   wherein the device is programmable to identify extraneous commands from the remote control device, said extraneous commands not being counted as said detections; and
   wherein when the number of detections exceeds a predetermined number during the predetermined time period, an indication is provided.

8. A device for detection and indication of frequent use of a remote control device for an apparatus, comprising:
   a detector which detects when the remote control device is used by detecting infrared light transmissions from the remote control device; and
   a counter which counts a number of detections during a predetermined time period;
   wherein the device is programmable to recognize at least one identification code provided through the remote control device, and wherein the recognition of the at least one identification code alters operation of the device; and
   wherein when the number of detections exceeds a predetermined number during the predetermined time period, an indication is provided.

9. A device for detection and indication of frequent use of a remote control device for an apparatus, comprising:
   a detector which detects when the remote control device is used, the detector comprising a photo diode sensitive to infrared light and a conditioning circuit which conditions an output of the photo diode; and
   a counter which counts a number of detections during a predetermined time period;
   wherein the conditioning circuit comprises:
      an amplifier connected to an output of the photo diode;
      a bandpass filter connected to an output of the amplifier; and
      a limiter connected to an output of the bandpass filter; and
   wherein when the number of detections exceeds a predetermined number during the predetermined time period, an indication is provided.

10. The device of claim 9, wherein the conditioning circuit further comprises a resistor-capacitor network designed to only pass changes in an output signal of the detector representing successive uses of the remote control device which are separated by more than a minimum time period.

11. The device of claim 10, wherein the counter comprises:
    a resistor-capacitor network; and
    a comparator.

12. The device of claim 9, wherein the conditioning circuit further comprises a monostable multivibrator designed to produce conditioned pulses which represent changes in an output signal of the detector representing successive uses of the remote control device which are separated by more than a minimum time period.

13. The device of claim 12, wherein the counter comprises:
    a conditioned pulse counter connected to an output of the monostable multivibrator; and
    an elapsed duration timer providing a time period during which the conditioned pulses are counted by the conditioned pulse counter.

14. The device of claim 13, wherein the counter further comprises a reset mechanism to reset a count of the conditioned pulses detected during a current said time period during which the conditioned pulses are counted by the conditioned pulse counter.

15. The device of claim 13, wherein the counter further comprises an indication timer used to determine how long the indication is provided.

16. The device of claim 9, wherein the counter is implemented with a programmed microcomputer.

* * * * *